US007754585B2

(12) United States Patent
Sato et al.

(10) Patent No.: US 7,754,585 B2
(45) Date of Patent: Jul. 13, 2010

(54) METHOD OF HEAT TREATMENT OF SILICON WAFER DOPED WITH BORON

(75) Inventors: Yuji Sato, Kanagawa (JP); Shirou Yoshino, Kanagawa (JP); Hiroshi Furukawa, Kanagawa (JP); Hiroyuki Matsuyama, Kanagawa (JP)

(73) Assignee: Sumco Techxiv Corporation, Nagasaki (JP)

( * ) Notice: Subject to any disclaimer, the term of this patent is extended or adjusted under 35 U.S.C. 154(b) by 0 days.

(21) Appl. No.: 10/433,314

(22) PCT Filed: Dec. 21, 2001

(86) PCT No.: PCT/JP01/11256

§ 371 (c)(1),
(2), (4) Date: Jun. 2, 2003

(87) PCT Pub. No.: WO02/052632

PCT Pub. Date: Jul. 4, 2002

(65) Prior Publication Data

US 2004/0048456 A1 Mar. 11, 2004

(30) Foreign Application Priority Data

Dec. 22, 2000 (JP) .............................. 2000-389777

(51) Int. Cl.
*H01L 21/322* (2006.01)
(52) U.S. Cl. ...................... 438/471; 438/502; 438/509; 438/795; 117/2; 117/3; 257/E21.318
(58) Field of Classification Search ................ 438/350, 438/530, 471, 475, 473, 474, 502, 509, 492, 438/902, 795; 117/2, 3; 257/E21.318
See application file for complete search history.

(56) References Cited

U.S. PATENT DOCUMENTS

| 4,548,654 | A | * | 10/1985 | Tobin | ...................... 438/471 |
| 5,273,609 | A | * | 12/1993 | Moslehi | .................. 156/345.28 |
| 5,354,698 | A | * | 10/1994 | Cathey, Jr. | ................... 438/514 |
| 6,663,708 | B1 | * | 12/2003 | Morita et al. | .................... 117/3 |
| 2002/0076870 | A1 | * | 6/2002 | Rolfson et al. | ............... 438/199 |

FOREIGN PATENT DOCUMENTS

| EP | 0 603 849 A2 | 6/1984 |
| EP | 0926719 | 6/1999 |

(Continued)

OTHER PUBLICATIONS

Wolf et al.; Silicon Processing for the VLSI Era, vol. 1: Process Technology; 1986 Lattice Press, pp. 305-308.*

(Continued)

*Primary Examiner*—Julio J Maldonado
(74) *Attorney, Agent, or Firm*—Husch Blackwell Sanders LLP Welsh & Katz (57) ABSTRACT

A method of subjecting a silicon wafer doped with boron to a heat treatment in an argon atmosphere, wherein the argon atmosphere is replaced with a hydrogen atmosphere or a mixed gas of an argon gas and a hydrogen gas in a proper fashion, to thereby uniformize a boron concentration in the thickness direction of the surface layer of the silicon wafer doped with boron.

3 Claims, 6 Drawing Sheets

FOREIGN PATENT DOCUMENTS

| | | |
|---|---|---|
| JP | 04167433 | 6/1992 |
| JP | 10144696 | 5/1998 |
| JP | 10144697 | 5/1998 |
| JP | 10144698 | 5/1998 |
| JP | 2000058552 | 2/2000 |
| JP | 2002-100634 | 4/2002 |
| KR | 1999-0063518 | 7/1999 |

OTHER PUBLICATIONS

Wolf et al., Silicon Processing for the VLSI Era, vol. 1: Process Technology, 1986 by Lattice Press, pp. 280-282 and 299-308.*
Wolf, Silicon Processing for the VLSI Era, vol. 2: Prcoess Integration, 1990 by Lattice Press, pp. 381-384.*
Wolf et al., Silicon Processing for the VLSI Era, vol. 1: PRocess Technology, 1986 by Lattice Press, pp. 12-14.*
Woff et al., Silicon Processing for the VLSI Era, vol. 1: Process Technology, 1986 by Lattice Press, pp. 12-14.*
Wolf et al., Silicon Processing for the VLSI Era, vol. 1: Process Technology, 1986 by Lattice Press, pp. 12-14.*
Wolf et al., Silicon Processing for the VLSI Era, vol. 1 Process Technology, 1986 by Lattice Press, pp. 12-14.*
Article entitled "Formation of Periodic Step and Terrace Structure on Si(100) Surface during Annealing in Hydrogen Diluted with Inert Gas" (Journal of Vacuum Science and Technology; A. Vacuum, Surfaces and Films, American Institute of Physics, New York, NY US, (vol. 16, No. 3, Dated May 1998, pp. 1775-1778)), (Authors, Y. Kumagai, K. Namba, T. Komeda and Y. Nishioka).
Article entitled "High Performance Silicon Wafer with Wide Grown-In Void Free Zone and High Density Internal Gettering Site Achieved Via Rapid Crystal Growth with Nitrogen Doping and High Temperature Hydrogen and/or Argon Annealing", (Electrochemical Society Proceedings, Electrochemical Society, Pennington, NJ) (vol. 99, No. 1, Dated May 1999, pp. 456-467). (Authors Masaro Tamaisuka, Noribiro Kobayashi, Satoshi Tobe and Tumoru Masui).
Article entitled "Outdiffusion of Impurity Atoms from Silicon Crystals and its Dependence upon the Annealing Atmosphere". (Applied Physics Letters, American Institute of Physics, New York) (vol. 68, No. 9, Dated Feb. 26, 1996 (Feb. 6, 1996; pp. 1229-1231)). (Authors, Lei Zhoing, Yoshio Kirino, Yoshiaki Matsushita, Yoshiro Aiba, Kenro Hayashi, Ryuji Takeda, hiroshi Shirai, Hiroyoki Saito, Junichi Matsushita, and Jun Yoshikawa).
Article entitled "Boron Contamination of Surfaces in Silicon Microelectronics Processing: Characterization and Causes". (Journal of Vacuum Science and Technology: Part A, American Institute of Physics, New York), (vol. 9, No. 5, Sep. 1991, pp. 2813-2816) (Authors, F.A. Stevie, E.P. Martin, Jr. P.M. Kahora, J.T. Cargo and A.K. Nanda).
Korean Office Action dated Nov. 22, 2007 for related application 10-2003-7006848.

* cited by examiner

METHOD OF HEAT TREATMENT OF SILICON WAFER DOPED WITH BORON

TECHNICAL FIELD

The present invention relates to a method for a heat treatment of a silicon wafer doped with boron in an argon atmosphere, which is effective in uniformizing the boron concentration in the thickness direction of the wafer surface layer.

BACKGROUND ART

It is generally observed that a silicon wafer cut out from a dislocation-free silicon monocrystal ingot grown by the Czochralski (CZ) method has a crystal defect called COP (Crystal Originated Particle). The COP is caused by voids introduced during the ingot growing process. When voids are exposed on the surface of the silicon wafer to form pits or, even if not exposed on the surface, when they are contained in the surface layer of the silicon wafer (i.e., when the COP is contained in a device activation area), they become a factor of causing a defect in the device properties, such as a defect in withstand voltage in the gate oxide film or a defect in leak characteristic.

In view of the circumstances described above, in order to remove the COP which is exposed on the surface of the silicon wafer or included in the surface layer, a heat treatment (annealing) is conducted in a nonoxidizing atmosphere such as a hydrogen atmosphere or an argon atmosphere at a high temperature of approximately 1200° C. (e.g., Japanese Patent Application Laid-Open Publications No. 58-85534 and No. 4-167433).

The above heat treatment (annealing) actually reduces or eliminates the COP exposed on the surface of the silicon wafer or contained in the surface layer by diff-using oxygen from the wafer surface layer to the outside.

But, when the silicon wafer having boron as a dopant is annealed in a hydrogen atmosphere, not only oxygen but also boron is diffused from the wafer surface layer to the outside. Thus, there is a drawback that a resistivity in the vicinity of the wafer surface layer becomes different from the initially assumed one.

In this connection, Japanese Patent Application Laid-Open Publication No. 10-144698 discloses a method of treating a silicon wafer containing boron in an argon atmosphere with almost no change in a distribution of boron based on a discovery made by the inventors that when the silicon wafer containing boron is annealed in the argon atmosphere, boron is hardly diffused to the outside but only oxygen is selectively diffused to the outside.

However, the invention described in Japanese Patent Application Laid-Open Publication No. 10-144698 is strictly conducted as a pretreatment of epitaxial growth. In practice, it cannot fully uniformize the boron concentration in the thickness direction of the wafer surface layer.

DISCLOSURE OF THE INVENTION

The prevent invention has been made in view of the above circumstances and provides a method which can fully uniformize a boron concentration in a thickness direction of a surface layer of a silicon wafer doped with boron.

In order to achieve the above object, the present inventors have made a devoted study and found that when the silicon wafer doped with boron is annealed in argon, the boron concentration in the thickness direction of the surface layer of the silicon wafer increases temporarily and then lowers gradually.

It is said that when annealing in argon is conducted, the boron concentration in the thickness direction of the vicinity of the surface layer becomes uniform. And, there are commercially available silicon wafers having a uniform boron concentration. But, such silicon wafers were also observed that the boron concentration in the wafer surface layer increased temporarily and lowered gradually.

As to the phenomenon of temporal increase in the boron concentration, the present inventors have found that the boron concentration in the thickness direction of the surface layer of the silicon wafer can be uniformized by appropriately applying an effect of lowering the boron concentration by annealing in hydrogen to remove excessive boron contained in the wafer surface layer and then annealing in argon, and achieved the present invention.

The present inventors consider that the temporal increase in boron concentration in the surface layer of the silicon wafer is caused by adhesion of boron to the silicon wafer because of some cause prior to charging into a heat treatment furnace.

More specifically, the present invention provides the following.

(1) A method of subjecting a silicon wafer doped with boron to a heat treatment in an argon atmosphere, wherein the argon atmosphere is replaced by a hydrogen atmosphere or "a mixed gas of an argon gas and a hydrogen gas" in a proper fashion, to thereby uniformize the boron concentration in the thickness direction of the surface layer of "the silicon wafer doped with boron".

The "wafer surface layer" is basically assumed to have a range of within 5 μm from the wafer surface, and more preferably within 10 μm.

(2) A method of subjecting a silicon wafer doped with boron to a heat treatment in an argon atmosphere, wherein the heat treatment is performed in the initial stage of the heat treatment with the argon atmosphere replaced by a hydrogen atmosphere or "a mixed gas of an argon gas and a hydrogen gas" in a proper fashion, to thereby remove contamination of the boron from a surface of the silicon wafer doped with boron in a stage prior to the heat treatment and to perform a subsequent heat treatment in the argon atmosphere.

The heat treatment in the hydrogen atmosphere or "the mixed gas of an argon gas and a hydrogen gas" performed in a proper fashion in the initial stage of the heat treatment in a nonoxidizing atmosphere is to uniformize the boron concentration in the thickness direction of the wafer surface layer.

The "initial stage of the heat treatment" is a concept including both of from the initial time of the heat treatment of the silicon wafer (when hydrogen is flown in the heat treatment furnace from the beginning of the heat treatment and replaced by argon in due course to perform the heat treatment) and the initial certain period of the heat treatment of a silicon wafer (when argon is first flown into the heat treatment furnace and replaced by hydrogen in due course to perform the heat treatment, then replaced by argon again to continue the heat treatment). Excessive boron contained in the wafer surface layer is removed by performing the heat treatment in hydrogen in the above stage to uniformize the boron concentration in the thickness direction of the wafer+surface layer, and the annealing in argon is performed. And, the boron concentration in the thickness direction of the wafer surface layer is kept in the uniform state by annealing in argon. As a result, a silicon wafer with the uniformized boron concentration in the thickness direction of the surface layer can be obtained by the present invention.

(3) The method according to (1) or (2) above, wherein "the mixed gas of an argon gas and a hydrogen gas" is "a mixed gas of an argon gas and a hydrogen gas" containing the hydrogen gas in a concentration of an explosion limit or below.

(4) A method of annealing in argon with a hydrogen gas added to uniformize a boron concentration in a thickness direction of a surface layer of a silicon wafer doped with boron.

In the above (4), "with a hydrogen gas added to uniformize a boron concentration in the thickness direction of the surface layer of a silicon wafer doped with boron" means, for example, "addition of hydrogen in the initial stage of annealing in argon to perform the heat treatment with hydrogen".

In that case, the hydrogen heat treatment in the initial stage can be performed at a temperature in a range of, for example, 800° C. to 1200° C. For example, when the hydrogen heat treatment is performed at less than 800° C. while the temperature of the heat treatment furnace is being increased (e.g., hydrogen is added at 300° C., annealing in hydrogen is performed at 300° C. to 500° C., and switching to the argon atmosphere is made at 500° C.), it is not practical because an effect of removing boron from the wafer surface layer by annealing in hydrogen delays. Meanwhile, for example when the heat treatment in hydrogen is performed at a temperature exceeding 1200° C. while the temperature of the heat treatment furnace is being increased (e.g., hydrogen is added at 1210° C., annealing in hydrogen is performed at 1210° C. to 1300° C., and switching to the argon atmosphere is made at 1300° C.), annealing in argon is made before reaching 1200° C., and the effect by annealing in argon is produced in advance. Thus, the effect of removing boron by annealing in hydrogen intended by the present invention may not be provided satisfactorily.

The above conditions are variable depending on the heat treatment conducted in 100% of hydrogen, the heat treatment conducted in the mixed gas with argon or time of annealing in hydrogen, but the present invention can be performed at a temperature of 800° C. to 1200° C. even in 4% of hydrogen which is an explosion limit of hydrogen. And, when the heat treatment is performed in hydrogen in concentration of 100%, the invention can be performed at a temperature less than 800° C., and the hydrogen heat treatment time becomes short.

In either case, the condition of "the heat treatment in hydrogen in the initial stage" according to the present invention is determined by totally considering a wafer to be obtained, a state of the apparatus and others.

(5) A method of subjecting a silicon wafer doped with boron to a heat treatment in a nonoxidizing atmosphere while uniformizing a boron concentration in a thickness direction of a surface layer of "the silicon wafer doped with boron" using the boron adhered to the surface of the silicon wafer.

The "nonoxidizing atmosphere" means an ordinary nonoxidizing atmosphere, such as a hydrogen atmosphere or an argon atmosphere, used to eliminate the COP in the vicinity of the surface layer of the silicon wafer.

(6) A method of using a hydrogen gas or "a mixed gas of an argon gas and a hydrogen gas" to uniformize a boron concentration in a thickness direction of a surface layer of "a silicon wafer doped with boron".

(7) The method according to any one of (1) to (6) above, wherein "the silicon wafer doped with boron" is a silicon wafer of silicon doped with boron in a non-high concentration.

The "non-high concentration" used in the present invention means a boron concentration of preferably $1 \times 10^{16}$ atoms/cm$^3$ or below, and more preferably $1 \times 10^{15}$ atoms/cm$^3$ or below, and most preferably $1 \times 10^{14}$ atoms/cm$^3$ or below.

(8) A silicon wafer produced by the method according to any one of (1) to (5) above, wherein "the silicon wafer doped with boron" is a silicon wafer of silicon doped with boron in a non-high concentration.

(9) A method of subjecting a silicon wafer doped with boron to a heat treatment in an argon atmosphere, wherein when a surface of the silicon wafer is contaminated with boron in a stage prior to the heat treatment, the heat treatment is performed in hydrogen or "a mixed gas of an argon gas and a hydrogen gas" in the initial stage of the heat treatment in the argon atmosphere, to thereby uniformize a boron concentration in a thickness direction of a surface layer of "the silicon wafer doped with boron" after the heat treatment.

Thus, when the heat treatment is performed in hydrogen or the "mixed gas of an argon gas and a hydrogen gas" in the initial stage of the heat treatment in the argon atmosphere, contamination of boron is removed from the surface of the silicon wafer, and annealing is performed with the wafer surface cleaned. And, in this case, after the wafer surface is cleaned, annealing is performed in the argon atmosphere, that boron is less diffused to the outside, to uniformize the boron concentration in the thickness direction of the wafer surface layer.

BEST MODE FOR CARRYING OUT THE INVENTION

Figure 1:
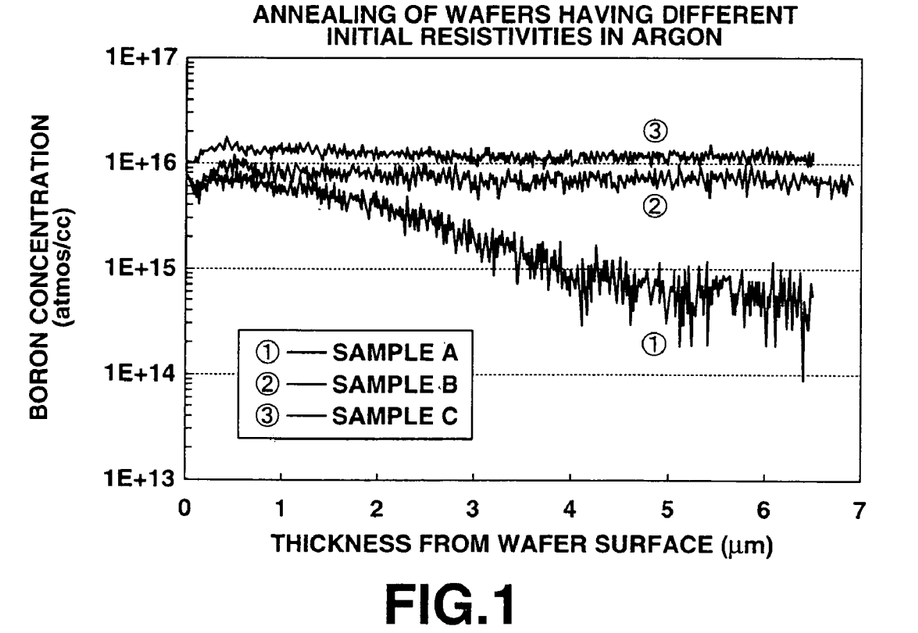
FIG. 1 is a graph showing a change in boron concentration in a wafer thickness direction at the time when silicon wafers doped with boron and having different initial resistivities were annealed in argon.
Figure 2:
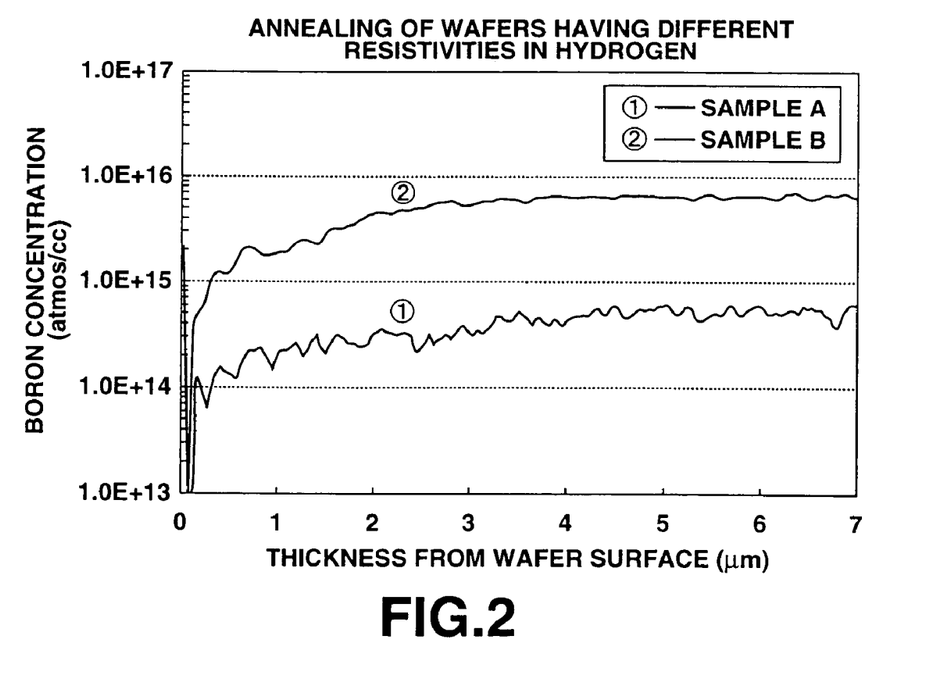
FIG. 2 is a graph showing a change in boron concentration in a wafer thickness direction at the time when silicon wafers doped with boron and having different initial resistivities were annealed in hydrogen.

Embodiments of the invention will be described. FIG. 1 is a graph showing a change in boron concentration in the wafer thickness direction at the time when "silicon wafers doped with boron" and having different initial resistivities were annealed in argon, and FIG. 2 is a graph showing a change in boron concentration in the wafer thickness direction at the time when "silicon wafers doped with boron" and having different initial resistivities were annealed in hydrogen.

The boron concentration was detected by an SIMS (Secondary Ion Mass Spectroscopy).

In this embodiment, the silicon wafer used is a P-type boron-doped silicon wafer formed on a (100) plane with a diameter of 200 mm. The P-type boron-doped silicon wafer has an oxygen concentration of 10.0 to $15.0 \times 10^{17}$ atoms/cm$^3$ and a resistivity of 1 to 30 Ω-cm.

As indicated by sample A shown in FIG. 1, when a silicon wafer doped with boron of a non-high concentration (a silicon wafer which is doped with boron to a non-high concentration) is annealed in argon, there is observed a phenomenon that the boron concentration in the wafer thickness direction is temporarily increased and then gradually lowered at a given portion in the wafer surface layer. The occurrence of such a phenomenon regardless of the annealing temperature or the annealing time was confirmed by the present inventors.

Meanwhile, it is generally known well that boron is diffused to the outside after the annealing in hydrogen, and its concentration in the surface layer is decreased as shown in FIG. 2.

But, the distribution of boron concentration in the surface layer may be uniform when annealed in argon but the boron concentration often increases in the surface layer as shown in FIG. 1. In this connection, it is described in Japanese Patent Application Laid-Open Publication No. 10-144698 that the diffusion of boron to the outside by the heat treatment in an argon atmosphere is hard, but the reason for the phenomenon that the boron concentration increases is unknown.

Figure 3:
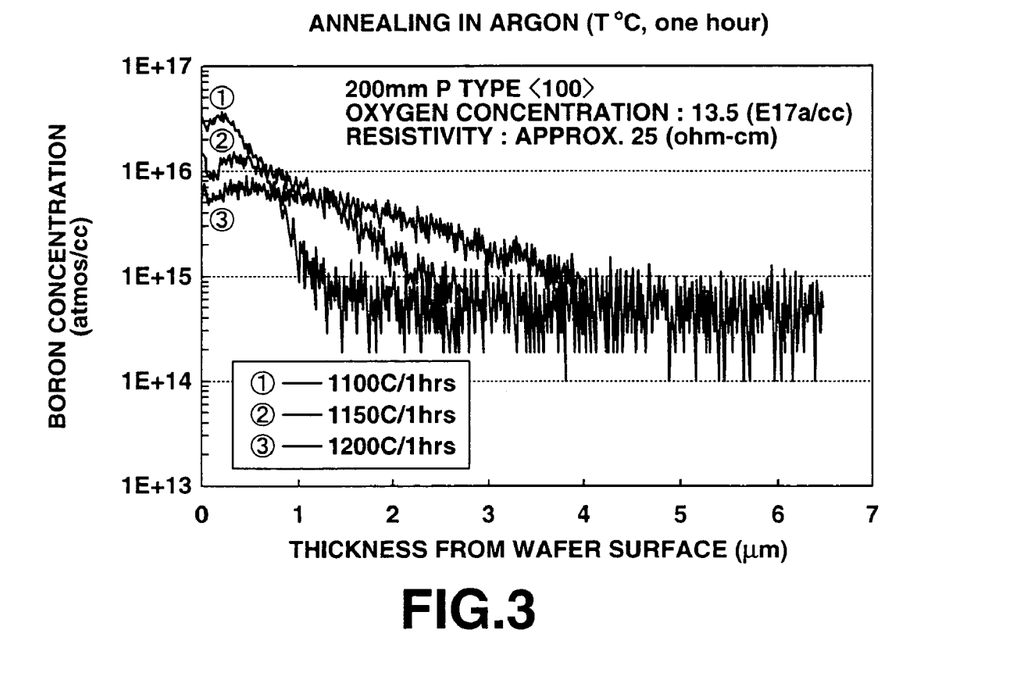
FIG. 3 is a graph showing results obtained when a silicon wafer doped with boron at a non-high concentration was annealed in argon with a heat treatment temperature changed to 1100° C., 1150° C., and 1200° C. for a prescribed heat treatment period (one hour)
Figure 4:
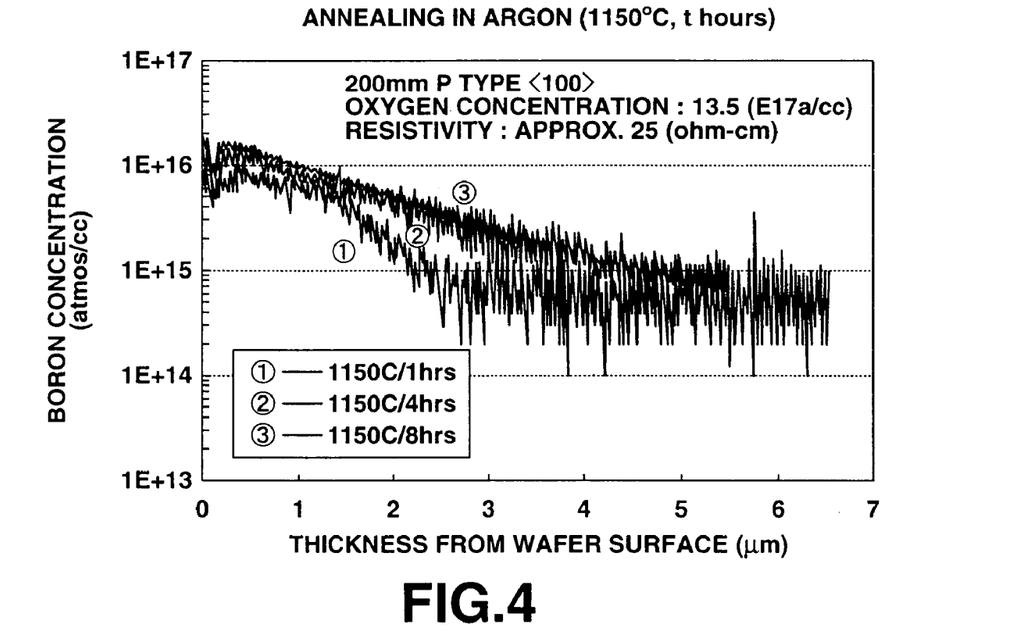
FIG. 4 is a graph showing results obtained when a silicon wafer was annealed in argon at a prescribed heat treatment temperature (1150° C.) with a heat treatment period changed to one hour, four hours and eight hours.

Under the circumstances described above, the present inventors have conducted annealing in argon with the treatment temperature and time varied in order to obtain clues to the cause of the increase in boron concentration in the surface layer. As a result, it was found that the boron concentration in the surface layer increases at all levels, but the concentration near the surface lowers as the temperature becomes high and the time becomes long, and the concentration is diffused to become high toward the inside (FIG. 3 and FIG. 4).

It suggests that boron already adhered in the stage before the annealing in argon has diff-used to the inside because boron is not always supplied from the outside of the wafer during the heat treatment. On the other hand, it is presumed that the boron concentration in the surface layer lowers when annealed in hydrogen because boron adhered to the surface reacts with hydrogen and removed during the annealing, and the boron in the surface layer is diffused to the outside of the wafer.

Therefore, it was considered that uniform boron distribution can be obtained by adding hydrogen or gas containing hydrogen to separate the boron adhered to the surface layer at a moment in a preliminary step of holding at 1200° C. in annealing in argon and then treating with argon. And, a desired result was obtained by performing the following experiment.

Embodiment 1

Switching to hydrogen or gas containing hydrogen (argon dilution) was performed with timing as shown in Table 1, each gas was kept at each temperature for 24 minutes, and annealing in argon was continued at 1200° C.

The used wafer was a P-type (boron doped) with a diameter of 200 mm and having a resistivity of 10 to 20 (Ω·cm).

TABLE 1

CZ wafer, 200 mm P-type, Resistivity: 10-20 (Ω · cm)

| Level | Hydrogen addition temperature (° C.) | Added hydrogen ratio (%) |
|---|---|---|
| 1 | 800 | 100 |
| 2 | 800 | 4 |
| 3 | 1000 | 100 |
| 4 | 1000 | 4 |
| 5 | 1200 | 100 |
| 6 | 1200 | 4 |

Figure 5:
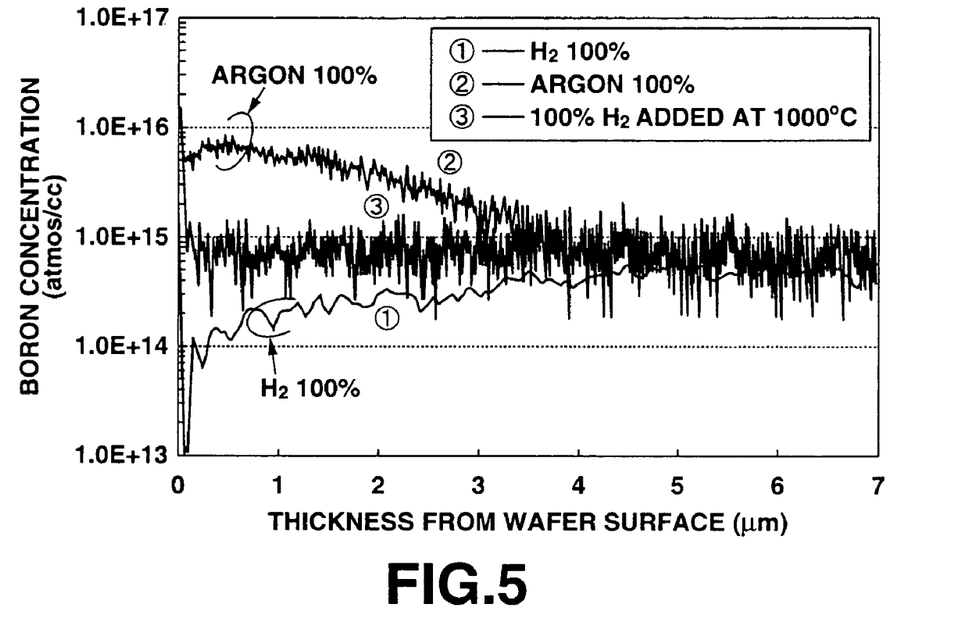
FIG. 5 is a graph showing the boron concentration distribution obtained when a silicon wafer was annealed in argon with hydrogen added in the initial stage of the heat treatment, the boron concentration distribution obtained by treating with argon only, and the boron concentration distribution obtained by treating with hydrogen only.
Figure 6:
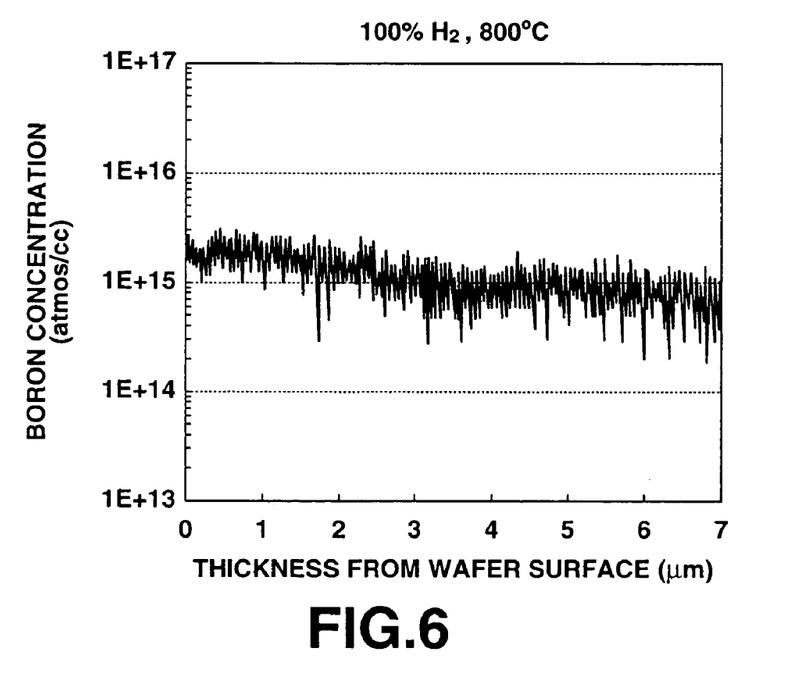
FIG. 6 is a graph showing the boron concentration distribution obtained when the added hydrogen concentration at the initial state was 100% and. a heat treatment temperature at the time of adding hydrogen was 800° C.
Figure 7:
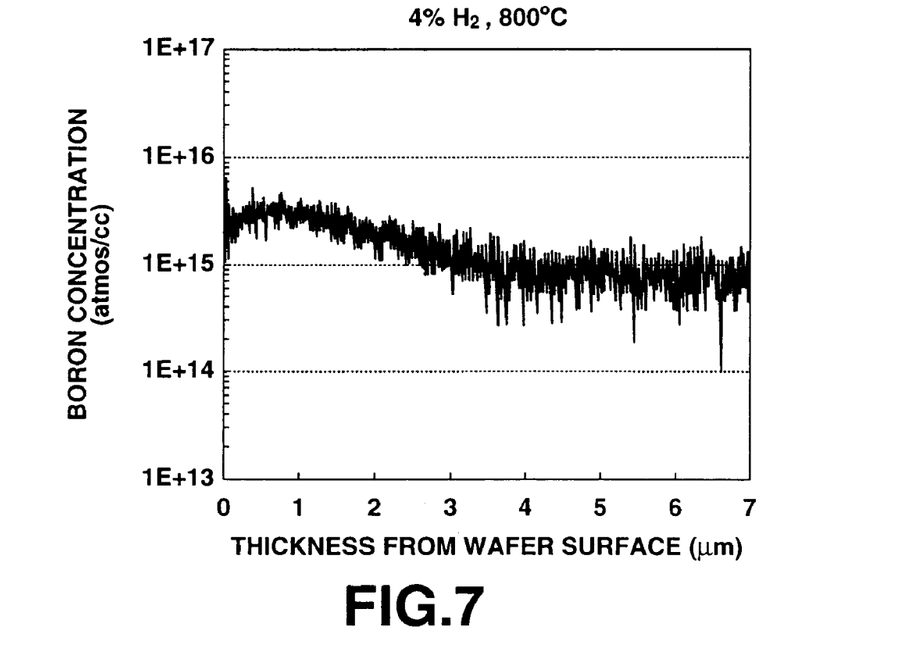
FIG. 7 is a graph showing the boron concentration distribution obtained when the added hydrogen concentration in the initial stage was 4% and a heat treatment temperature at the time of adding hydrogen was 800° C.
Figure 8:
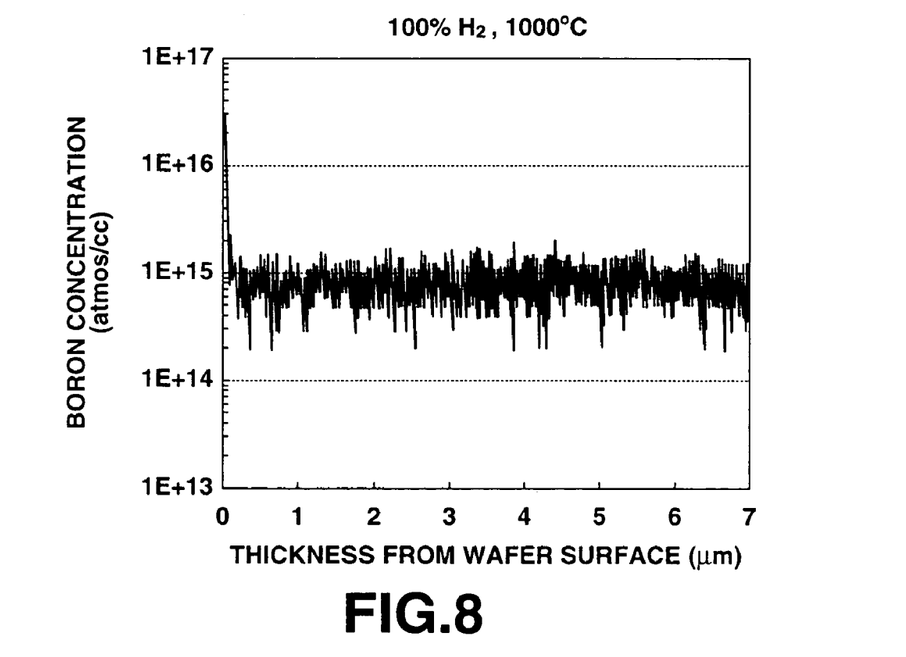
FIG. 8 is a graph showing the boron concentration distribution obtained when the added hydrogen concentration in the initial stage was 100% and a heat treatment temperature at the time of adding hydrogen was 1000° C.
Figure 9:
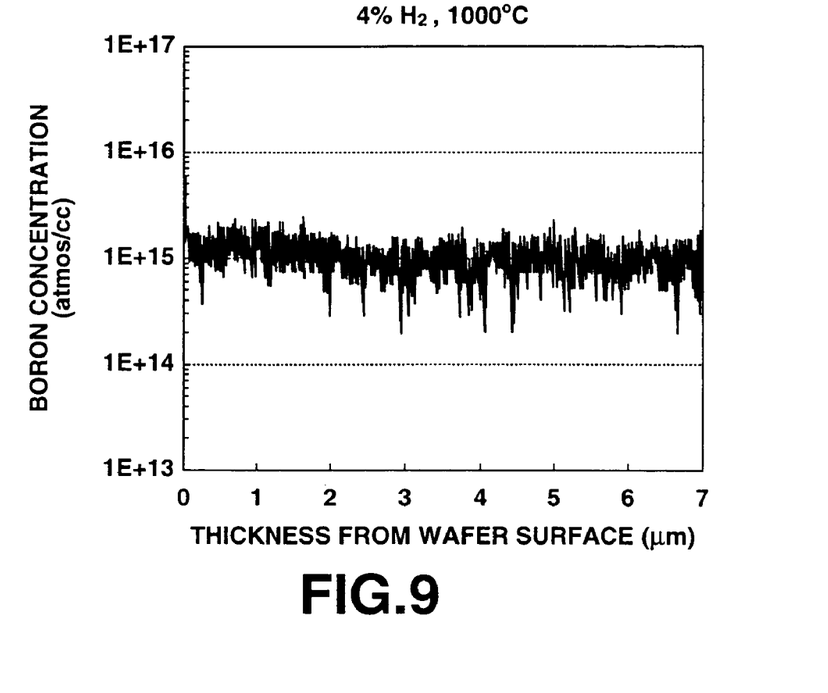
FIG. 9 is a graph showing the boron concentration distribution obtained when the added hydrogen concentration in the initial stage was 4% and a heat treatment temperature at the time of adding hydrogen was 1000° C.
Figure 10:
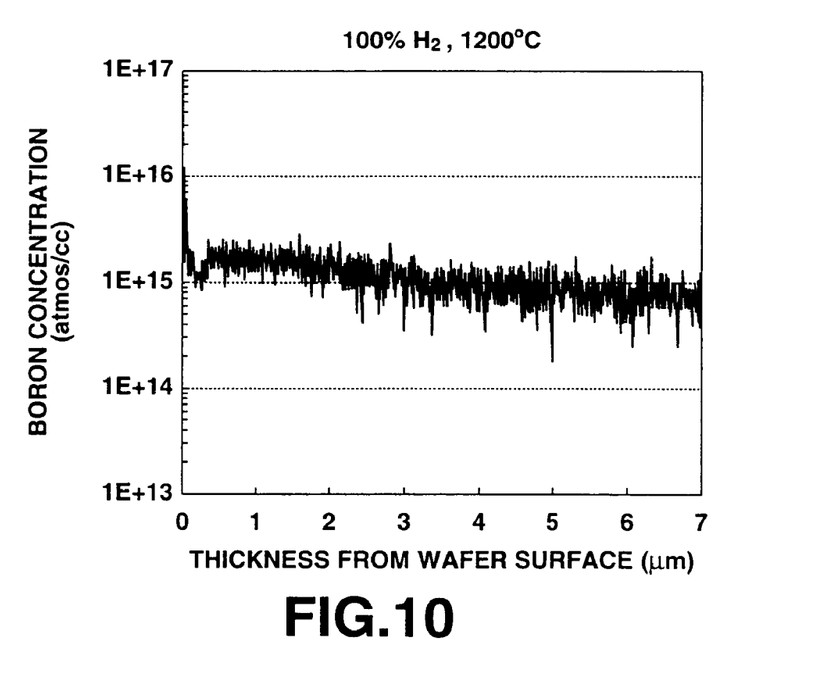
FIG. 10 is a graph showing the boron concentration distribution obtained when the added hydrogen concentration in the initial stage was 100% and a heat treatment temperature at the time of adding hydrogen was 1200° C.
Figure 11:
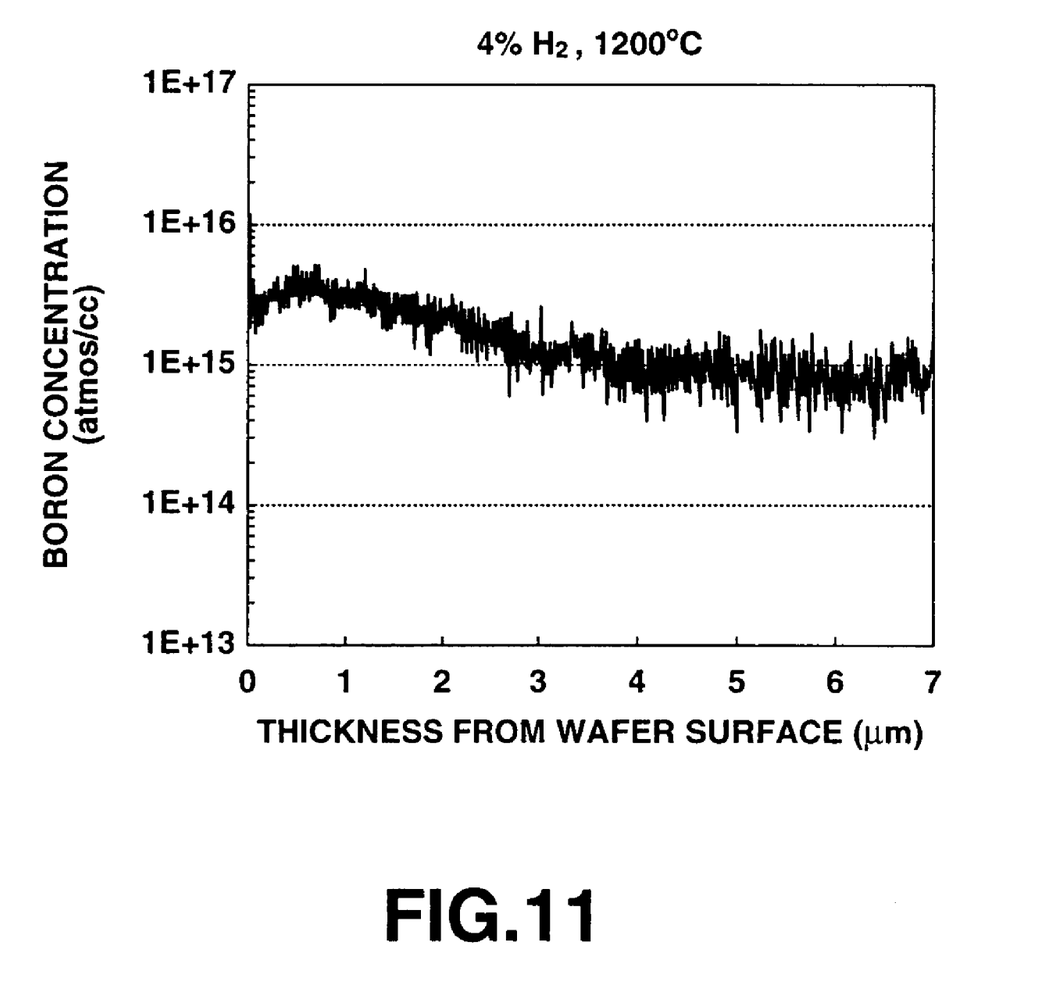
FIG. 11 is a graph showing the boron concentration distribution obtained when the added hydrogen concentration in the initial stage was 4% and a heat treatment temperature at the time of adding hydrogen was 1200° C.

One example of the SIMS analysis results obtained by annealing is shown in FIG. 5. Fore comparison, FIG. 5 shows the boron concentration distribution after treating with argon only and the boron concentration distribution after treating with hydrogen only. It is seen from FIG. 5 that a boron concentration in the surface layer is uniformized by annealing in argon with hydrogen added in the initial stage of heat treatment.

Then, the boron concentration distribution was examined when hydrogen was added in concentrations of 4% and 100% in the initial stage with a heat treatment temperature varied to 800° C., 1000° C. and 1200° C. The results are shown in FIG. 6 to FIG. 11.

The results shown in FIG. 6 to FIG. 11 are summarized as follows.
1) The boron concentration in the surface layer could be suppressed from increasing by adding the hydrogen gas in the preliminary step of holding at a high temperature to perform annealing in argon.
2) For timing to switch to the hydrogen gas, a temperature of 800° C. or higher is sufficient when 100% of hydrogen is added.
3) When 4% of hydrogen is added, boron in the surface has a slight increasing trend but it is effectively suppressed.

As described above, when the silicon wafer doped with boron in a non-high concentration is annealed in argon, the boron concentration increases temporarily at a given portion in the wafer surface layer, so that the argon atmosphere is appropriately switched to the hydrogen atmosphere or "the mixed gas of an argon gas and a hydrogen gas" in agreement with the timing of the formation of such a portion. Thus, the boron concentration in the thickness direction of the surface layer of the silicon wafer doped with boron can be uniformized.

Otherwise, when the silicon wafer doped with boron in a low concentration is subject to a heat treatment in an atmosphere of "a mixed gas of an argon gas and a hydrogen gas", it is considered that the boron concentration in the wafer thickness direction of the surface layer of the silicon wafer doped with boron can be uniformized by varying a mixing ratio of the hydrogen gas in the "mixed gas of an argon gas and a hydrogen gas".

In this connection, to perform the present invention, a heat treatment furnace for annealing in hydrogen is basically used because the invention includes a heat treatment process with a hydrogen gas, but an explosion-proof construction required when the hydrogen gas is used becomes unnecessary by controlling the "mixed gas of an argon gas and a hydrogen gas" to contain the hydrogen gas in a concentration (concentration of 4% or below) of an explosion limit or below, and the heat treatment furnace as the whole is made to have a smaller heat capacity. Thus, the heat treatment furnace having structure specifications capable of quickly raising or lowering a temperature can be provided. And, it becomes possible to reduce the annealing time.

As described above, the present invention can fully uniformize the boron concentration in the thickness direction of the wafer surface layer of the silicon wafer doped with boron in a non-high concentration.

The invention claimed is:

1. A method for uniformizing a boron concentration in a surface layer of a p-type silicon wafer at a depth up to 10 μm from a surface of the silicon wafer, said p-type silicon wafer cut out from a silicon ingot grown by a Czochralski method and doped with boron in a concentration of $1\times10^{16}$ atoms/cm$^3$ or below, said surface layer of the p-type silicon wafer up to 10 μm from the surface being a device activation area for fabricating a device, wherein when the silicon wafer is subjected to a heat treatment in a heat treatment furnace at a temperature of up to 1200° C., an entire surface of the silicon wafer has been contaminated with boron prior to charging the silicon wafer into the heat treatment furnace, the heat treatment comprises:

a first step of removing contamination of the boron adhering to the surface of the silicon wafer by reacting the boron with hydrogen during the heat treatment in a hydrogen 100% atmosphere and a temperature environment of 1200° C. or less, or in a mixed gas of argon gas and hydrogen gas and a temperature environment of 800° C. or higher and less than 1200° C. and a second step of replacing the atmosphere with an atmosphere consisting of argon, and performing the heat treatment in the argon atmosphere at a temperature of up to 1200° C., the temperature being held at 1200° C. finally.

2. The method according to claim 1 wherein the mixed gas of the argon gas and the hydrogen gas is a mixed gas of an argon gas and a hydrogen gas containing the hydrogen gas in a concentration of an explosion limit or below.

3. A method for uniformizing a boron concentration in a surface layer of a p-type silicon wafer at a depth up to 10 μm from a surface of the silicon wafer, said p-type silicon wafer cut out from a silicon ingot grown by a Czochralski method and doped with the boron in a concentration of $1\times10^{16}$ atoms/cm$^3$ or below, said surface layer of the p-type silicon wafer up to 10 μm from the surface being a device activation area for fabricating a device wherein when the silicon wafer is subjected to a heat treatment in a heat treatment furnace at temperature of up to 1200° C., an entire surface of the silicon wafer has been contaminated with the boron prior to charging the silicon wafer into the heat treatment furnace, the heat treatment comprises:

a first step of removing contamination of the boron adhering to the surface of the silicon wafer by performing the heat treatment at a temperature of 1200° C. or less in an atmosphere of argon and hydrogen and by reacting the boron with the hydrogen during the heat treatment; and a second step of replacing the atmosphere with an atmosphere consisting of argon, and performing the heat treatment in the argon atmosphere at a temperature of up to 1200° C., the temperature being held at 1200° C. finally.

* * * * *

UNITED STATES PATENT AND TRADEMARK OFFICE
CERTIFICATE OF CORRECTION

PATENT NO. : 7,754,585 B2
APPLICATION NO. : 10/433314
DATED : July 13, 2010
INVENTOR(S) : Sato et al.

It is certified that error appears in the above-identified patent and that said Letters Patent is hereby corrected as shown below:

Title Page item 75

Please delete

"Yuji Sato, Kanagawa (JP); Shirou Yoshino, Kanagawa (JP); Hiroshi Furukawa, Kanagawa (JP); Hiroyuki Matsuyama, Kanagawa (JP)"

Please insert:

-- Yuji Sato, Nagasaki (JP); Shirou Yoshino, Nagasaki (JP); Hiroshi Furukawa, Nagasaki (JP); Hiroyuki Matsuyama, Nagasaki (JP) --

Signed and Sealed this

Ninth Day of November, 2010

David J. Kappos
*Director of the United States Patent and Trademark Office*